US009270118B2

(12) United States Patent
Carlson et al.

(10) Patent No.: US 9,270,118 B2
(45) Date of Patent: Feb. 23, 2016

(54) TECHNIQUES FOR CONTROLLING ENERGY GENERATION AND STORAGE SYSTEMS

(75) Inventors: Eric Daniel Carlson, San Mateo, CA (US); Karthikeyan Varadarajan, Mountain View, CA (US)

(73) Assignee: SolarCity Corporation, San Mateo, CA (US)

( * ) Notice: Subject to any disclaimer, the term of this patent is extended or adjusted under 35 U.S.C. 154(b) by 618 days.

(21) Appl. No.: 13/553,603

(22) Filed: Jul. 19, 2012

(65) Prior Publication Data

US 2014/0025220 A1    Jan. 23, 2014

(51) Int. Cl.
H02J 3/00 (2006.01)
H02J 3/32 (2006.01)
B60L 11/18 (2006.01)
H02J 13/00 (2006.01)

(52) U.S. Cl.
CPC ............... *H02J 3/32* (2013.01); *B60L 11/1838* (2013.01); *H02J 13/0017* (2013.01); *Y02E 60/722* (2013.01); *Y04S 10/14* (2013.01)

(58) Field of Classification Search
None
See application file for complete search history.

(56) References Cited

U.S. PATENT DOCUMENTS

| | | | | |
|---|---|---|---|---|
| 6,882,904 B1 * | 4/2005 | Petrie et al. | | 700/295 |
| 6,900,556 B2 * | 5/2005 | Provanzana et al. | | 307/19 |
| 7,130,719 B2 | 10/2006 | Ehlers et al. | | |
| 7,161,483 B2 | 1/2007 | Chung | | |
| 7,274,975 B2 * | 9/2007 | Miller | | 700/295 |
| 7,373,222 B1 * | 5/2008 | Wright et al. | | 700/295 |
| 8,350,521 B2 * | 1/2013 | Reineccius | | 320/101 |
| 8,401,709 B2 | 3/2013 | Cherian et al. | | |
| 8,471,406 B2 * | 6/2013 | Patel et al. | | 307/66 |
| 8,478,452 B2 * | 7/2013 | Pratt et al. | | 700/297 |
| 2007/0043478 A1 * | 2/2007 | Ehlers et al. | | 700/276 |
| 2007/0200433 A1 * | 8/2007 | Kelty | | 307/66 |
| 2007/0271006 A1 * | 11/2007 | Golden et al. | | 700/295 |
| 2008/0046387 A1 * | 2/2008 | Gopal et al. | | 705/412 |
| 2008/0053513 A1 * | 3/2008 | Palmer | | 136/246 |
| 2009/0066287 A1 * | 3/2009 | Pollack et al. | | 320/101 |
| 2009/0222143 A1 * | 9/2009 | Kempton | | 700/291 |
| 2010/0231045 A1 * | 9/2010 | Collins et al. | | 307/47 |
| 2010/0286841 A1 | 11/2010 | Subbloie | | |

(Continued)

FOREIGN PATENT DOCUMENTS

WO    WO 2011/039610 A1 * 4/2011

OTHER PUBLICATIONS

Office Action for U.S. Appl. No. 13/553,653 mailed Oct. 23, 2014; 38 pages.

(Continued)

*Primary Examiner* — Christopher E Everett
(74) *Attorney, Agent, or Firm* — Kilpatrick Townsend & Stockton LLP

(57) ABSTRACT

Techniques for controlling energy generation and/or storage systems. In one embodiment, a method is provided that can comprise receiving from a control server a plurality of schedules for controlling the charging and discharging of an energy storage device, where each schedule corresponds to a function that takes as input one or more input parameters and returns as output an output parameter corresponding to a power level for the energy storage device. The method can further comprise determining relative priorities for the plurality of schedules and controlling charging/discharging of the energy storage device based on the plurality of schedules and their relative priorities.

20 Claims, 12 Drawing Sheets

(56) References Cited

U.S. PATENT DOCUMENTS

| | | |
|---|---|---|
| 2011/0046792 A1 | 2/2011 | Imes et al. |
| 2011/0276194 A1 | 11/2011 | Emalfarb et al. |
| 2012/0005126 A1* | 1/2012 | Oh et al. ............ 705/412 |
| 2012/0065801 A1* | 3/2012 | Rossi et al. .......... 700/295 |
| 2012/0089261 A1* | 4/2012 | Kim ................... 700/286 |
| 2012/0233094 A1* | 9/2012 | Mise et al. .......... 705/412 |
| 2013/0047010 A1* | 2/2013 | Massey et al. ....... 713/320 |
| 2013/0054045 A1* | 2/2013 | Ramezani et al. .... 700/297 |
| 2014/0015469 A1* | 1/2014 | Beaston et al. ...... 320/101 |
| 2014/0020244 A1* | 1/2014 | Carlson et al. ....... 29/825 |
| 2014/0025215 A1 | 1/2014 | Carlson et al. |

OTHER PUBLICATIONS

Tang, "Deployment of Smart Energy Containers as Reinforcement to Undeveloped Electrical Distribution Networks," Master Thesis, Royal Institute of Technology, Stockholm, Sweden, 2011, 87 pages.

* cited by examiner

| 3PM | 4PM | 5PM | 6PM | 7PM | 8PM | 9PM | 10PM | 11PM | MIDNIGHT |
|---|---|---|---|---|---|---|---|---|---|
| 15 | 15 | 15 | 0 | -15 | -15 | -15 | -15 | -15 | 0 |

*FIG. 6*

|     | 20% | 30% | 40% | 50% | 60% | 70% | 80% | 90% | 100% |
|---|---|---|---|---|---|---|---|---|---|
| 20  | 0 | 0 | 0 | 0 | 0 | 3 | 5 | 8 | 8 |
| 30  | 0 | 0 | 0 | 0 | 0 | 3 | 5 | 8 | 8 |
| 40  | 0 | 0 | 0 | 0 | 3 | 5 | 10 | 10 | 10 |
| 50  | 0 | 0 | 0 | 0 | 3 | 5 | 10 | 10 | 10 |
| 60  | 0 | 0 | 0 | 0 | 5 | 10 | 15 | 15 | 15 |
| 70  | 0 | 0 | 0 | 0 | 5 | 10 | 15 | 15 | 15 |
| 80  | 0 | 0 | 0 | 0 | 5 | 10 | 15 | 15 | 15 |
| 90  | 0 | 0 | 0 | 0 | 5 | 10 | 20 | 20 | 20 |
| 100 | 0 | 0 | 0 | 0 | 5 | 10 | 20 | 20 | 20 |

*FIG. 7*

TECHNIQUES FOR CONTROLLING ENERGY GENERATION AND STORAGE SYSTEMS

CROSS REFERENCE TO RELATED APPLICATIONS

The present application incorporates by reference for all purposes the entire contents of the following concurrently filed applications: (1) U.S. Non-Provisional application Ser. No. 13/553,639, filed Jul. 19, 2012, which is U.S. Pat. No. 8,996,191, entitled "TECHNIQUES FOR PROVISIONING ENERGY GENERATION AND STORAGE SYSTEMS"; and (2) U.S. Non-Provisional application Ser. No. 13/553,653, entitled "SOFTWARE ABSTRACTION LAYER FOR ENERGY GENERATION AND STORAGE SYSTEMS".

BACKGROUND

The present disclosure relates in general to energy generation and storage systems, and in particular to techniques for facilitating the management of such systems.

In recent years, climate change concerns, federal/state initiatives, and other factors have driven a rapid rise in the installation of renewable energy generation systems (i.e., systems that generate energy using renewable resources such as solar, wind, hydropower, etc.) at residential and non-residential sites. Solar photovoltaic (PV) systems, in particular, have been very popular; in 2011, nearly two gigawatts of PV capacity were installed in the United States, and that number is expected to double in 2012. The majority of this PV capacity is "grid-connected"—in other words, tied to the utility-maintained electrical grid. This allows site loads to be serviced from the grid at times when the PV system cannot generate sufficient energy due to lack of sunlight (e.g., at night), while enabling energy to be fed back into the grid at times when PV energy production exceeds site loads (thereby resulting in, e.g., a credit on the site owner's electricity bill and allowing the benefits of this energy conveyed to others on the grid).

One limitation with grid-connected PV systems is that, unlike a traditional power plant, the PV system power output is intermittent and not dispatchable. This means that the PV system is limited in its ability to provide power capacity at times of peak grid loads. The PV system is also limited in its ability to balance grid voltage and frequency variability, and to supply energy when prices are most economic. Most PV systems are reliant on the presence of a utility grid to operate due to safety regulations in place to protect utility workers, meaning the PV system cannot supply local loads when the utility grid is shut down or otherwise unavailable. Thus, in the case of a grid blackout, such systems cannot act as a backup energy source to power critical site loads, regardless of the amount of sunlight being received at the time of the blackout. To address this, systems have been developed that integrate grid-connected PV components with an on-site energy storage subsystem, such as a battery device and a battery inverter/charger. In these integrated systems, the energy storage subsystem can store excess energy as it is generated by the PV components, and then dispatch the stored energy to satisfy local and grid wide loads as needed. In addition, this energy storage capability enables a number of other features that can provide benefits to the site owner or the installer/service provider of the system, such as the ability to "time shift" energy usage to minimize energy costs and/or earn revenue, or the ability to control instantaneous power demand at a given site.

Despite the advantages associated with integrating grid-connected PV energy generation with on-site energy storage, there are a number of challenges that make it difficult to efficiently deploy and control such integrated systems, particularly on a large, distributed scale. For example, existing PV/energy storage systems typically require manual provisioning by an on-site technician prior to use, which is a time-consuming, cumbersome, and error-prone process. As another example, it is generally beneficial to control the charging and discharging of the energy storage devices in these systems via a central authority (e.g., a remote server administered by the system installer or service provider). However, current implementations do not allow for such control in a flexible and efficient manner. As yet another example, the PV and energy storage components used in existing systems may be supplied by a number of different vendors, each utilizing different vendor-specific communication protocols. This complicates the process of designing control components and algorithms, since the components/algorithms need to interoperate with each of the vendor-specific protocols.

SUMMARY

Embodiments the present invention relate to techniques for controlling energy generation and/or storage systems. According to one embodiment, a method is provided that can comprise receiving, by a site gateway from a control server, a plurality of schedules for controlling the charging and discharging of an energy storage device, where each schedule corresponds to a function that takes as input one or more input parameters and returns as output an output parameter corresponding to a power level for the energy storage device. The method can further comprise determining, by the site gateway, relative priorities for the plurality of schedules, and controlling charging/discharging of the energy storage device based on the plurality of schedules and their relative priorities.

In one embodiment, determining the relative priorities for the plurality of schedules can comprise receiving priority information from the control server.

In one embodiment, the priority information can include, for each schedule in the plurality of schedules, a schedule identifier, a priority value, and a priority operator.

In one embodiment, the priority operator can be selected from a group consisting of "max," "min," and "target." The max priority operator can indicate that the function corresponding to the schedule defines a maximum permissible upper bound on the power level for the energy storage device. The min priority operator can indicate that the function corresponding to the schedule defines a minimum permissible lower bound on the power level for the energy storage device. And the target priority operator can indicate that the function corresponding to the schedule defines an exact power level for the energy storage device.

In one embodiment, controlling the charging and discharging of the energy storage device based on the plurality of schedules and their relative priorities can comprise initializing a variable $P_{batt}$ and, for each schedule in the plurality of schedules, ordered from lowest priority to highest priority, performing the following: if the priority operator for the schedule is "max," setting the output of the function corresponding to the schedule to a variable $P_{max}$, and setting $P_{batt}$ to the lesser of $P_{max}$ and $P_{batt}$; else if the priority operator for the schedule is "min," setting the output of the function corresponding to the schedule to a variable $P_{min}$, and setting $P_{batt}$ to the greater of $P_{min}$ and $P_{batt}$; else if the priority operator for the schedule is "target," setting the function corresponding to the schedule to $P_{batt}$. The energy storage device can then be charged or discharged based on $P_{batt}$.

In one embodiment, at least one schedule in the plurality of schedules can correspond to a function that takes as input two or more input parameters.

In one embodiment, the two or more input parameters can include time of day, state of charge of the energy storage device, or site power consumption.

In one embodiment, the function can be expressed as an N-dimensional array, where each value in the array represents a power level for the energy storage device, and where each dimension of the array represents an input parameter of the function.

In one embodiment, each schedule in the plurality of schedules can be based on one or more use cases for optimizing economic value of the energy storage device.

In one embodiment, the one or more use cases can include a use case for keeping a predefined percentage of energy storage device energy reserved for critical loads, a use case for keeping peak power demand below a predefined threshold, a use case for regulating grid voltage and frequency, and a use case for buying and selling energy storage device energy at predefined times of day.

In one embodiment, at least one schedule in the plurality of schedules can be defined by a utility company configured to provide power for charging the energy storage device.

In one embodiment, each schedule in the plurality of schedules can be associated with a start time indicating a time at which the schedule should take effect for controlling charging and discharging of the energy storage device.

In one embodiment, the start time can be dependent on a time at which the site gateway last made contact with the control server.

In one embodiment, each schedule in the plurality of schedules can be further associated with an end time indicating a time at which the schedule should no longer take effect for controlling charging and discharging of the energy storage device.

In one embodiment, the end time can be dependent on the time at which the site gateway last made contact with the control server.

In one embodiment, the energy storage device can be a battery, and the site gateway can be configured to control the energy storage device by communicating with a battery inverter/charger.

In one embodiment, the site gateway can be further configured to communicate with an energy inverter coupled with an energy generation source and with a utility meter coupled with a utility power grid, and the energy storage device can be charged using energy received from the energy generation source or from the utility power grid.

According to another embodiment of the present invention, a non-transitory computer readable medium is provided that has stored thereon program code executable by a computer system. The program code can comprise code that causes the computer system to receive, from a control server, a plurality of schedules for controlling charging and discharging of an energy storage device, where each schedule in the plurality of schedules corresponds to a function that takes as input one or more input parameters and returns as output an output parameter corresponding to a power level for the energy storage device; code that causes the computer system to determine relative priorities for the plurality of schedules; and code that causes the computer system to control charging and discharging of the energy storage device based on the plurality of schedules and their relative priorities.

According to another embodiment of the present invention, a system is provided that comprises a processor. The processor can be configured to receive, from a control server, a plurality of schedules for controlling charging and discharging of an energy storage device, where each schedule in the plurality of schedules corresponds to a function that takes as input one or more input parameters and returns as output an output parameter corresponding to a power level for the energy storage device; determine relative priorities for the plurality of schedules; and control charging and discharging of the energy storage device based on the plurality of schedules and their relative priorities.

A further understanding of the nature and advantages of the embodiments disclosed herein can be realized by reference to the remaining portions of the specification and the attached drawings.

BRIEF DESCRIPTION OF THE DRAWINGS

FIG. 6 is an array data structure for representing the function of FIG. 4 according to an embodiment of the present invention.

FIG. 7 is an array data structure for representing the function of FIG. 5 according to an embodiment of the present invention.

DETAILED DESCRIPTION

Figure 1:
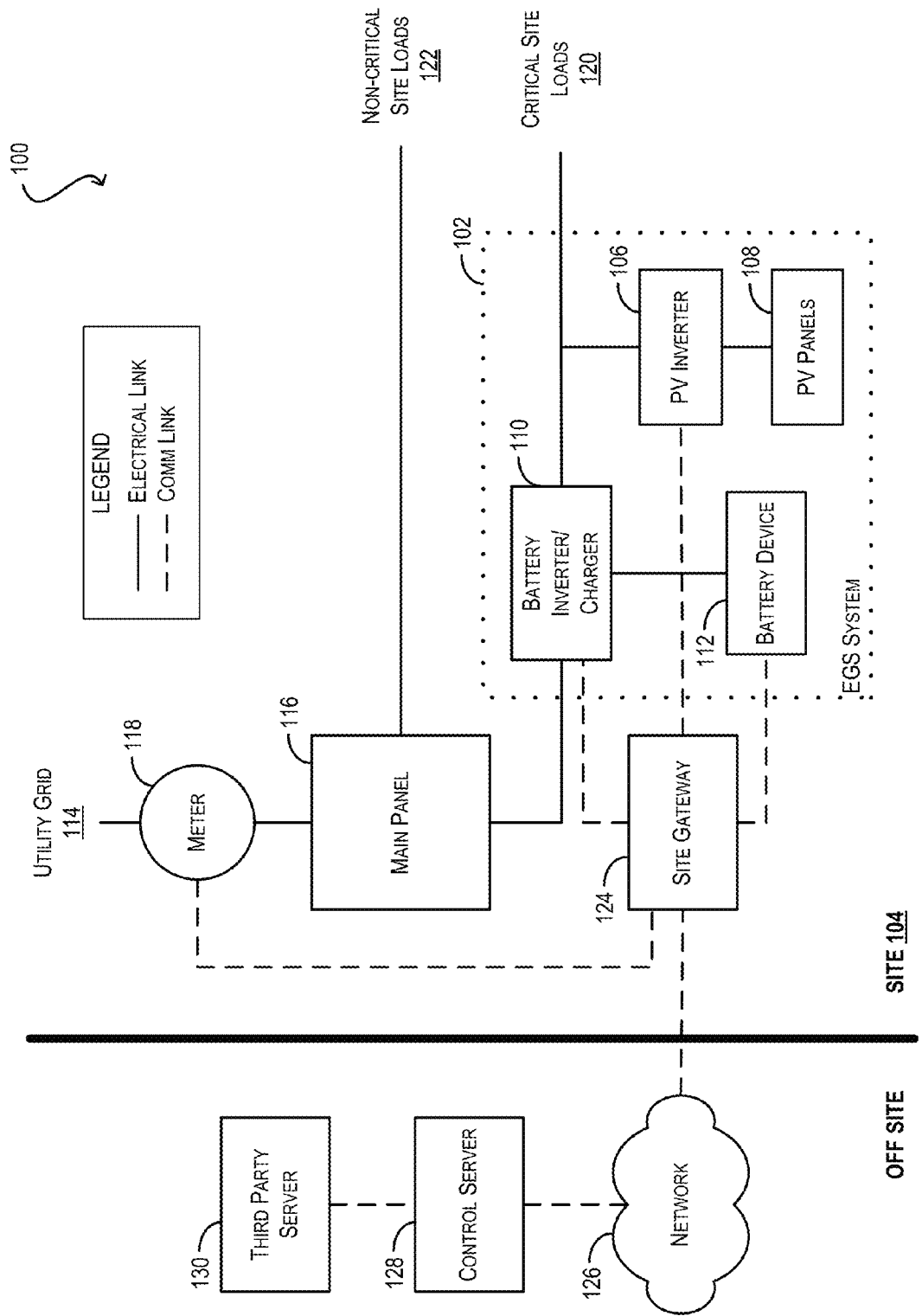
FIG. 1 is a simplified block diagram of a system environment according to an embodiment of the present invention.

In the following description, for purposes of explanation, numerous examples and details are set forth in order to provide an understanding of embodiments of the present invention. It will be evident, however, to one skilled in the art that certain embodiments can be practiced without some of these details, or can be practiced with modifications or equivalents thereof.

The present disclosure relates to systems and methods for managing grid-connected energy generation and/or storage (EGS) systems. In one set of embodiments, a computing device (referred to herein as a "site gateway") can be installed at the site of an EGS system. The site gateway can be communicatively coupled with a control server that is remote from the system site and is maintained by, e.g., the system installer or a designated service provider. Together, the site gateway and the control server can interoperate to facilitate deployment and control of the various components of the EGS system. For example, in one embodiment, the site gateway can receive from the control server a plurality of schedules for an energy storage device associated with the EGS system. Each schedule can correspond to a function that takes as input one or more input parameters (e.g., time of day, energy storage device state of charge, energy storage device state of health, grid voltage, grid frequency, site power consumption, etc.) and returns as output a power level for the energy storage device. Further, each schedule can be associated with a priority. Upon receiving these schedules, the site gateway can regulate charging and discharging of the energy storage device based on the schedules and their respective priorities.

In another embodiment, the site gateway can automatically determine operating specifications for one or more components of the EGS system. This can be accomplished by, e.g., performing one or more operational tests with respect to the components, or querying the control server or a component database. The site gateway can then use the automatically determined specifications to configure (i.e., provision) the EGS system for use. With this feature, there is no need for a technician to manually provision system components on-site. Instead, the entire provisioning process can be automated by the site gateway, without human intervention.

In yet another embodiment, the site gateway can incorporate a software abstraction layer for translating high-level control commands and operating parameters for EGS system components into low-level, vendor-specific commands and parameters, and vice versa. In many instances, the components installed at a particular site will be supplied by a number of different vendors, each utilizing different vendor-specific communication protocols. Further, the same site gateway may be installed at multiple, distinct sites. With the software abstraction layer described herein, the control server and site gateway can utilize control algorithms that view EGS components as generic, rather than vendor-specific, energy generation or storage devices. Each generic device can expose a standardized set of commands and parameters. When the site gateway needs to communicate such standardized commands/parameters to a particular physical component, the commands/parameters can be automatically converted via the software abstraction layer into the vendor-specific protocol supported by the component. In this manner, the site gateway can easily interoperate with a wide range of EGS components that are supplied by various different vendors. In a further embodiment, the software abstraction layer can group several distinct physical components (e.g., a battery device and a battery inverter/charger) into a single, generic logical device, thereby providing another level of abstraction that is useful for high-level control.

For purposes of illustration, several of the examples and embodiments that follow are described in the context of EGS systems that use solar PV technology for energy generation and battery technology for energy storage. However, it should be appreciated that embodiments of the present invention are not limited to such implementations. For example, in some embodiments, alternative types of energy generation technologies (e.g., wind turbine, solar-thermal, geothermal, biomass, hydropower, etc.) may be used. In other embodiments, alternative types of energy storage technologies (e.g., compressed air, flywheels, pumped hydro, superconducting magnetic energy storage (SMES), etc.) may be used. One of ordinary skill in the art will recognize many modifications, variations, and alternatives.

FIG. 1 is a simplified block diagram of a system environment 100 according to an embodiment of the present invention. As shown, system environment 100 includes an energy generation and storage (EGS) system 102 that is installed at a site 104 (e.g., a residence, a commercial building, etc.). EGS system 102 includes a PV-based energy generation subsystem comprising a PV inverter 106 and one or more PV panels 108, and a battery-based energy storage subsystem comprising a battery inverter/charger 110 and a battery device 112. In some embodiments, PV inverter 106 and battery inverter/charger 110 can be combined into a single device. In the example of FIG. 1, EGS system 102 is grid-connected; thus, PV inverter 106 and battery inverter/charger 110 are electrically connected to the utility grid (114) via a main panel 116 and a utility meter 118. Further, to provide power to site 104, utility grid 114, PV inverter 106, and battery inverter/charger 110 are electrically connected to critical site loads 120 and non-critical site loads 122.

As noted in the Background section, integrated EGS systems such as system 102 provide a number of advantages over energy generation systems that do not incorporate any on-site energy storage. For example, excess energy produced by PV components 106 and 108 can be stored in battery device 112 via battery inverter/charger 110 as a critical reserve. Battery inverter/charger 110 can then discharge this reserved energy from battery device 112 when utility grid 114 is unavailable (e.g., during a grid blackout) to provide backup power for critical site loads 120 until grid power is restored. As another example, battery device 112 can be leveraged to "time shift" energy usage at site 104 in a way that provides economic value to the site owner or the installer/service provider of EGS system 102. For instance, battery inverter/charger 110 can charge battery device 112 with energy from utility grid 114 (and/or PV inverter 106) when grid energy cost is low. Battery inverter/charger 110 can then dispatch the stored energy at a later time to, e.g., offset site energy usage from utility grid 114 when PV energy production is low/grid energy cost is high, or sell back the energy to the utility when energy buyback prices are high (e.g., during peak demand times).

Unfortunately, centralized management of EGS systems such as system 102 has proven to be difficult, particularly at the large scale needed for the residential and commercial markets. To address this, system environment 100 can include a site gateway 124 and a control server 128. Site gateway 124 is a computing device (e.g., a general purpose personal computer, a dedicated device, etc.) that is installed at site 104. As shown, site gateway 124 is communicatively coupled with on-site components 106, 110, 112, and 118, as well as with control server 128 via a network 126. In one embodiment, site gateway 124 can be a standalone device that is separate from EGS system 102. In other embodiments, site gateway 124 can be embedded or integrated into one or more components of system 102. Control server 128 is a server computer (or a cluster/farm of server computers) that is remote from site 104. Control server 128 may be operated by, e.g., the installer or service provider of EGS system 102, a utility company, or some other entity.

In one embodiment, site gateway 124 and control server 128 can carry out various tasks for monitoring the performance of EGS system 102. For example, site gateway 124 can collect system operating statistics, such as the amount of PV energy produced (via PV inverter 106), the energy flow to and from utility grid 114 (via utility meter 118), the amount of energy stored in battery device 112, and so on. Site gateway 124 can then send this data to control server 128 for long-term logging and system performance analysis.

More significantly, site gateway 124 and control server 128 can operate in tandem to actively facilitate the deployment and control of EGS system 102. For instance, in one set of embodiments, control server 128 can transmit to site gateway 124 a number of prioritized schedules for regulating the charging/discharging behavior of battery inverter/charger 110 and battery device 112. These schedules can be based on, and ranked by, considerations that pertain to the economic value of the energy stored in battery device 112, such as forecasted retail and wholesale energy prices, forecasted grid ancillary service prices, forecasted PV energy generation, forecasted power demand, and more. The schedules can also take into account third party-requested actions for balancing the flow of energy on utility grid 114. Such third party-requested actions can be transmitted to control server 128 via, e.g., a separate utility/ISO (Independent Service Operator) server 130. Once the schedules are received, site gateway 124 can send control signals to battery inverter/charger 110 for controlling the charging/discharging of battery device 112 based on the schedules and their respective priorities.

In further embodiments, site gateway 124 can automatically determine information pertaining to the components of EGS system 102 to automate system provisioning. For example, site gateway 124 can query control server 128 for site design information that may have been created and stored at the time of installing/designing system 102. This design information would likely include component-level information, such as make/model numbers, operating specifications, and/or the like. As another example, site gateway 124 can perform one or more operational tests to calculate the operating specifications of certain components. Site gateway 124 can then use this automatically determined information to configure (i.e., provision) EGS system 102 for use, without any human intervention.

In yet further embodiments, site gateway 124 can incorporate a software abstraction layer for translating high-level control commands and operating parameters for EGS system components into low-level, vendor-specific commands and parameters, and vice versa. With this software abstraction layer, the high-level control algorithms used by control server 128 and site gateway 124 do not need to be concerned with the specific protocols supported by each component of EGS system 102; rather, the control algorithms can view the components as generic energy generation or storage devices. When site gateway 124 needs to communicate a generic command or parameter to a particular physical component, the command/parameter can be automatically converted via the software abstraction layer into the vendor-specific protocol or format supported by the component.

Additional details regarding the foregoing features, as well as other features and advantages of the present invention, are presented below.

It should be appreciated that system environment 100 is illustrative and not intended to limit embodiments of the present invention. For instance, although FIG. 1 depicts control server 128 as being connected with a single EGS system (102) at a single site (104), server 128 can be simultaneously connected with a fleet of EGS systems that are distributed at multiple sites. In these embodiments, control server 128 can coordinate the scheduling of these various systems/sites to meet specific goals or objectives. In further embodiments, the various components depicted in system 100 can have other capabilities or include other subcomponents that are not specifically described. One of ordinary skill in the art will recognize many variations, modifications, and alternatives.

Figure 2:
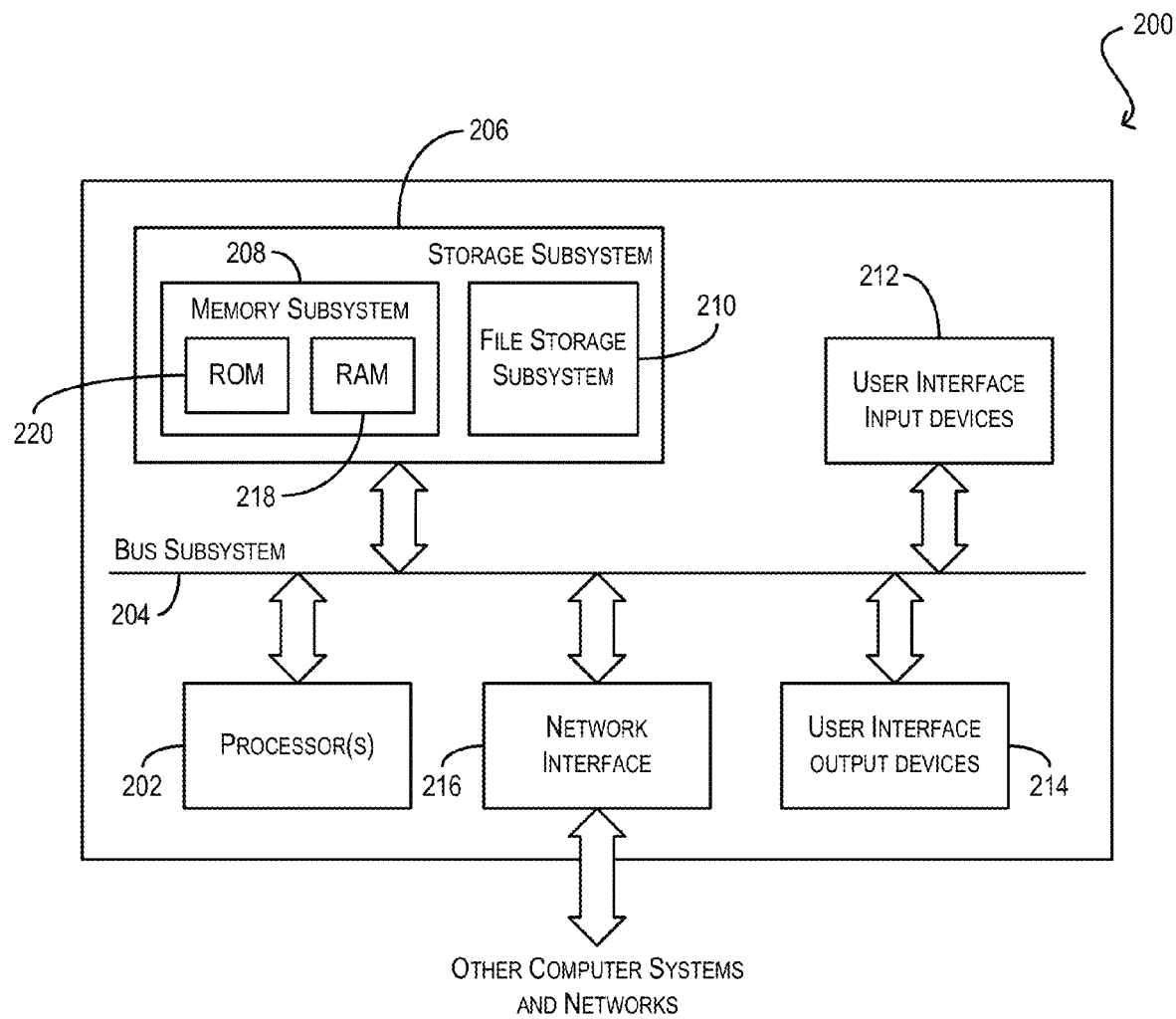
FIG. 2 is a simplified block diagram of a computer system according to an embodiment of the present invention.

FIG. 2 is a simplified block diagram of a computer system 200 according to an embodiment of the present invention. Computer system 200 can be used to implement any of the computer systems/devices (e.g., site gateway 124, control server 128, third-party server 130) described with respect to FIG. 1. As shown in FIG. 2, computer system 200 can include one or more processors 202 that communicate with a number of peripheral devices via a bus subsystem 204. These peripheral devices can include a storage subsystem 206 (comprising a memory subsystem 208 and a file storage subsystem 210), user interface input devices 212, user interface output devices 214, and a network interface subsystem 216.

Bus subsystem 204 can provide a mechanism for letting the various components and subsystems of computer system 200 communicate with each other as intended. Although bus subsystem 204 is shown schematically as a single bus, alternative embodiments of the bus subsystem can utilize multiple buses.

Network interface subsystem 216 can serve as an interface for communicating data between computer system 200 and other computer systems or networks (e.g., network 126 of FIG. 1). Embodiments of network interface subsystem 216 can include wired interfaces (e.g., Ethernet, CAN, RS232, RS485, etc.) or wireless interfaces (e.g., ZigBee, Wi-Fi, cellular, etc.).

User interface input devices 212 can include a keyboard, pointing devices (e.g., mouse, trackball, touchpad, etc.), a scanner, a barcode scanner, a touch-screen incorporated into a display, audio input devices (e.g., voice recognition systems, microphones, etc.), and other types of input devices. In general, use of the term "input device" is intended to include all possible types of devices and mechanisms for inputting information into computer system 200.

User interface output devices 214 can include a display subsystem, a printer, a fax machine, or non-visual displays such as audio output devices, etc. The display subsystem can be a cathode ray tube (CRT), a flat-panel device such as a liquid crystal display (LCD), or a projection device. In general, use of the term "output device" is intended to include all possible types of devices and mechanisms for outputting information from computer system 200.

Storage subsystem 206 can include a memory subsystem 208 and a file/disk storage subsystem 210. Subsystems 208 and 210 represent non-transitory computer-readable storage media that can store program code and/or data that provide the functionality of embodiments of the present invention.

Memory subsystem 208 can include a number of memories including a main random access memory (RAM) 218 for storage of instructions and data during program execution and a read-only memory (ROM) 220 in which fixed instructions are stored. File storage subsystem 210 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 200 is illustrative and not intended to limit embodiments of the present invention. Many other configurations having more or fewer components than system 200 are possible.

Centralized Energy Storage Control

Figure 3:
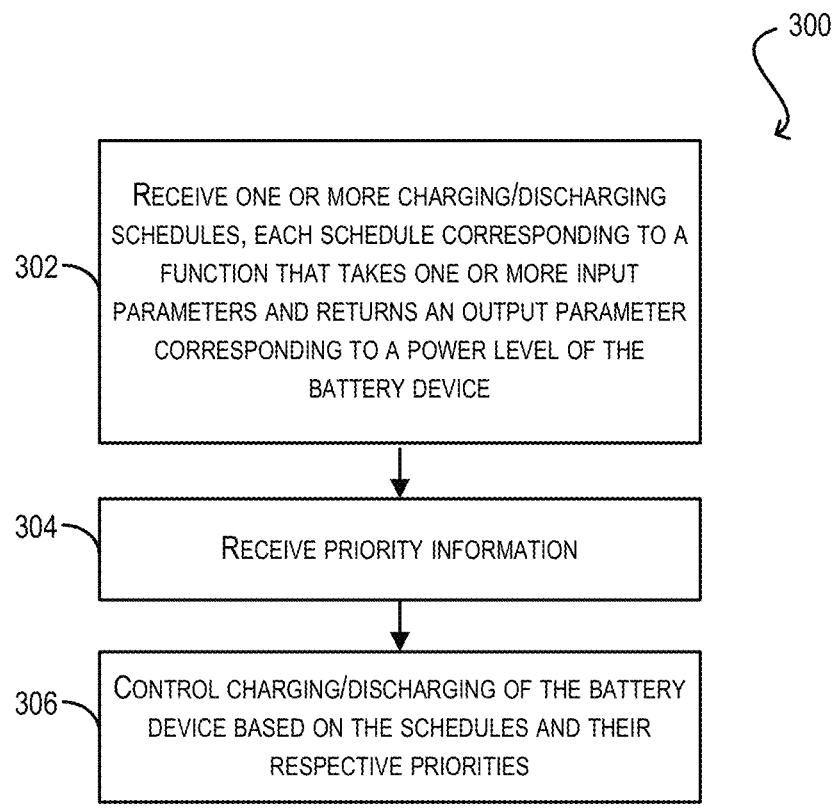
FIG. 3 is a flow diagram of a process for controlling charging/discharging of an energy storage device according to an embodiment of the present invention.

As discussed with respect to FIG. 1, control server 128 and site gateway 124 can interoperate in certain embodiments to centrally control the charging and discharging behavior of battery inverter/charger 110 and battery device 112. FIG. 3 illustrates a process 300 that can be carried out by site gateway 124 for implementing this feature.

At block 302, site gateway 124 can receive one or more charging/discharging schedules from control server 128, where each schedule corresponds to a function that takes as input one or more parameters (e.g., time of day, energy storage device state of charge, energy storage device state of health, grid voltage, grid frequency, site power consumption, etc.) and returns as output a power level for battery device 112. The output power level can be expressed as a positive number (indicating that battery device 112 should be discharged), a negative number (indicating that battery device 112 should be charged), or as zero (indicating that no charging or discharging should be performed). In a particular embodiment, the output power level can be specified in units of kilowatts (kW).

Generally speaking, each schedule received from control server 128 can model one or more use cases designed to create value using the energy stored in battery device 112. Examples of such use cases are presented in the table below:

TABLE 1

Use cases for energy storage control

| Use Case | Description |
| --- | --- |
| Backup power | Maintain and provide backup power for critical site loads when the utility grid goes down. |
| Time of use arbitrage | Take advantage of varying grid energy costs (typically higher during the day and lower at night) to reduce site energy costs and/or generate revenue. Can be achieved by, e.g., discharging stored energy during the day to support site loads (thereby reducing grid energy consumption when cost is high), and charging the energy storage device at night (thereby increasing grid energy consumption when cost is low). Excess energy capacity that is not needed to power site loads can be sold back to the utility during the day (when energy buyback prices are high) for profit. |
| Peak power demand reduction | Reduce large surges in site power consumption from the grid, which is typically charged at a higher rate. Can be achieved by offsetting grid power with stored energy when surges are needed, thereby keeping grid power draw below a certain threshold at all times. |
| PV variability reduction | Reduce variances in site power consumption from the grid that result from fluctuations in PV energy generation. |

TABLE 1-continued

Use cases for energy storage control

| Use Case | Description |
| --- | --- |
| Utility/ISO services | Feed stored energy into the grid or charge from the grid per utility/ISO requests to balance grid power, frequency or voltage, or to provide additional grid capacity at peak demand times. |

The specific types of schedules that are received at block 302 (and thus, the use cases that are implemented by the schedules) can be determined centrally by control server 128. This processing can take into account various considerations and constraints pertaining to EGS system 102 and/or a distributed fleet of EGS systems, such as business contracts between the site owner and the system installer/operator, forecasted retail and wholesale energy prices, forecasted PV energy generation, forecasted customer demand, fleet status (including available energy, power, and wear cycling), utility/ISO requested actions, and others. Thus, control server 128 can optimize the scheduling of battery inverter/charger 110 and battery device 112 based on both site specific and non-site specific (e.g., fleet level) factors.

Figure 4:
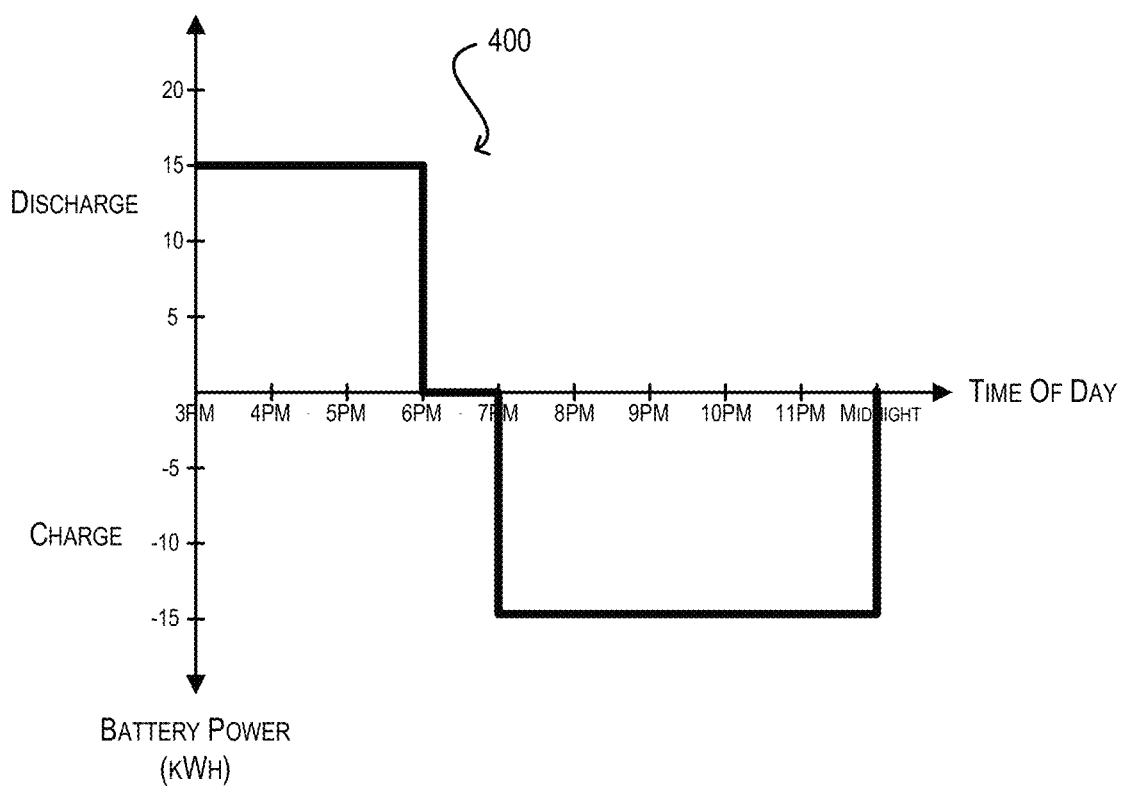
FIG. 4 is a graph illustrating a function corresponding to an exemplary charging/discharging schedule according to an embodiment of the present invention.

In certain embodiments, one or more of the schedules received at block 302 can correspond to functions that take as input a single input parameter. These functions can model use cases that are reliant on a single variable. For instance, FIG. 4 is a two-dimensional graph that illustrates an example function 400 for the "time of use arbitrage" use case described above. This use case is generally reliant solely on the time of day, which directly correlates to the price of buying energy from, or selling energy to, the utility. Accordingly, function 400 takes as input a single parameter "time of day" (x-axis) and returns as output the desired power level of battery device 112 (y-axis).

As shown, function 400 is configured to discharge battery device 112 during daylight hours (e.g., 3 PM-6 PM), and charge battery device 112 from the grid during at night (e.g., 7 PM-12:00 AM). This achieves the objective of storing energy from the grid when grid energy cost is low, and shifting the on-site use of that energy to times when grid energy cost is high.

Figure 5:
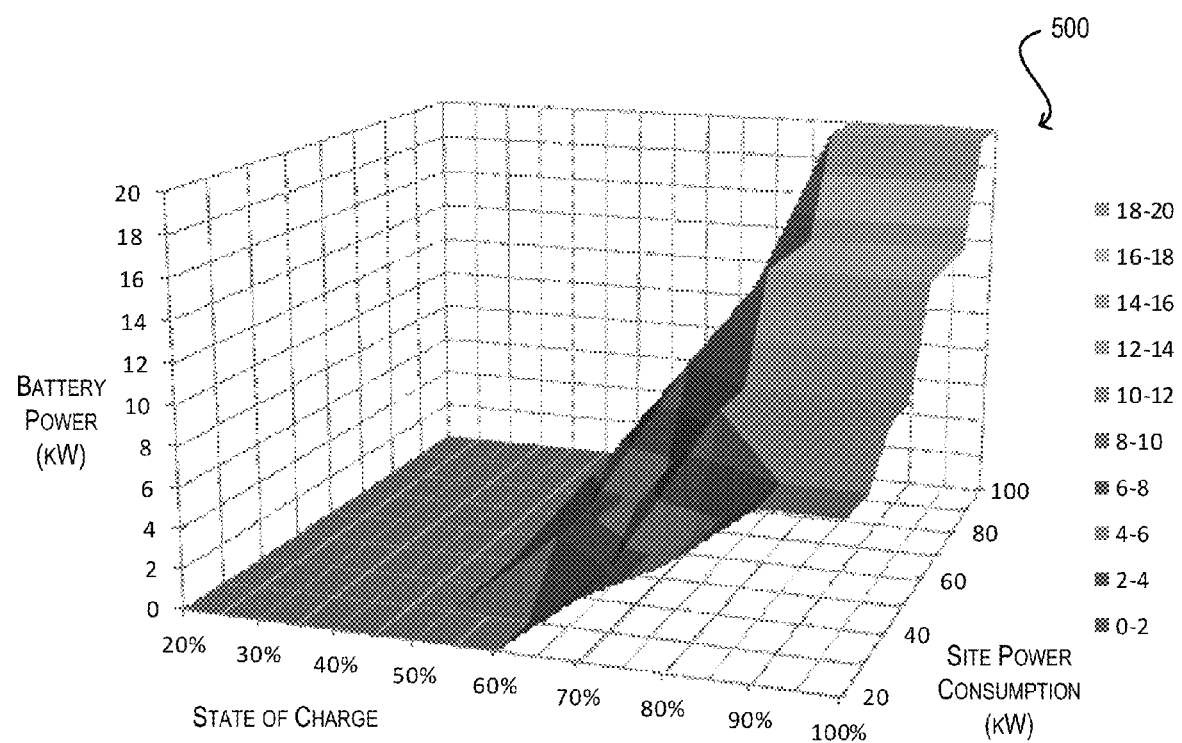
FIG. 5 is a graph illustrating a function corresponding to another exemplary charging/discharging schedule according to an embodiment of the present invention.

In other embodiments, one or more of the schedules received at block 302 can correspond to functions that take as input multiple input parameters (e.g., time of day, energy storage device state of charge, energy storage device state of health, grid voltage, grid frequency, site power consumption, etc.). These functions can model use cases that are reliant on multiple variables, or that model the interaction between multiple use cases simultaneously. For instance, FIG. 5 is a three-dimensional graph that illustrates an example function 500 for modeling a combination of the "backup power" and "peak power demand reduction" use cases described above. Specifically, function 500 models a rule stipulating that battery device 112 should always maintain a charge level of at least 50% (for emergency backup purposes), while at the same time reducing site peak power demand. Each of the "backup power" and "peak power demand reduction" use cases are reliant on a different variable (i.e., state of charge and site power consumption, respectively). Accordingly, function 500 takes as input both of these parameters ("state of charge" on the x-axis; "site power consumption" on the z-axis) and returns as output the desired power level of battery device 112 (y-axis).

As shown, function 500 is configured to discharge energy from battery device 112 when site power consumption is high, but also gradually decrease the magnitude of the discharge as the battery's state of charge decreases. Once the state of charge reaches 50%, the battery is prevented from discharging, regardless of the site power consumption. Thus, the objective of always maintain a minimum charge level of 50%, while also reducing site peak power demand when possible, is achieved.

In a particular embodiment, each schedule/function received at block 302 can be represented as an N-dimensional array, where each index dimension of the array corresponds to an input parameter to the function, and where the values of the array correspond to the output values of the function (i.e., battery power level). By way of example, FIGS. 6 and 7 depict array data structures 600 and 700 for representing functions 400 and 500 of FIGS. 4 and 5. As shown, data structure 600 is an array comprising a single index dimension corresponding to the single input parameter "time of day" for function 400. The array value for each index (e.g., 3 PM, 4 PM, etc.) corresponds to the output battery power level for that index as shown in FIG. 4. Similarly, data structure 700 is an array comprising two index dimensions corresponding to the two input parameters "state of charge" and "site power consumption" for function 500. The array value for each index pair (e.g., [50%, 20 kW]) corresponds to the output battery power level for that pair as shown in FIG. 5. By using this compact and efficient representation, the time and bandwidth needed to transfer schedule information between control server 128 and site gateway 124 can be minimized.

Returning to FIG. 3, once the charging/discharging schedules have been received, site gateway 124 can receive from control server 128 priority information for each schedule (block 304). This priority information can be used by site gateway 124 to determine how the received schedules should be applied to control battery inverter/charger 110 and battery device 112 in the face of potential scheduling conflicts. For instance, assume three schedules are received from control server 128: (1) a first schedule designed to always maintain at least 50% charge in battery device 112 for backup purposes; (2) a second schedule designed to prevent peak power draw from the utility grid from exceeding a threshold of 15 kW; and (3) a third schedule defined by the utility company to balance the ebb and flow of energy on utility grid 114. Unless each schedule was designed with the others in mind, it is likely that, at some point, there will be a conflict between these schedules that cannot be fully satisfied (e.g., one schedule may indicate that battery device 112 should be discharged while another schedule indicates that battery device 112 should be charged or maintained constant). With the priority information received at block 304, site gateway 124 can determine that one schedule should be given precedence over the other, conflicting schedules, and can regulate the charging/discharging of battery device 112 accordingly.

In one embodiment, the priority information received for each schedule at block 304 can include a schedule identifier, a priority value, and a priority operator. The schedule identifier can uniquely identify the schedule to which the priority information should apply. The priority value can be a numeric ranking that indicates the priority of the schedule relative to the other schedules received at block 302.

The priority operator can specify different ways in which a schedule can interact with other, conflicting schedules that have a lower priority. For example, in a particular embodiment, the priority operator can correspond to one of three values: "max," "min," and "target." The max priority operator can indicate that the function corresponding to a given schedule S1 defines a maximum permissible upper bound on the power level of battery device 112. Thus, if there is a conflicting schedule S2 that (1) specifies a higher power level than S1 and (2) has a lower priority than S1, site gateway 124 will set the power level of battery device 112 to the specified power level of S1 (since that is the maximum allowed by S1). On the other hand, if there is a conflicting schedule S3 that specifies a lower power level than S1, site gateway 124 can keep the power level of battery device 112 at the lower power level of S3 (since that does not exceed the power level of S1).

The min priority operator can indicate that the function corresponding to a given schedule S1 defines a minimum permissible lower bound on the power level of battery device 112. Thus, if there is a conflicting schedule S2 that (1) specifies a lower power level than S1 and (2) has a lower priority than S1, site gateway 124 will set the power level of battery device 112 to the specified power level of S1 (since that is the minimum allowed by S1). On the other hand, if there is a conflicting schedule S3 that specifies a higher power level than S1, site gateway 124 can keep the power level of battery device 112 at the higher power level of S3 (since that does not go below the power level of S1).

Finally, the target priority operator can indicate that the function corresponding to a given schedule S1 defines an exact power level for battery device 112. Thus, if there is a conflicting schedule S2 that (1) specifies a power level that is different (in any way) from S1 and (2) has a lower priority than S1, site gateway 124 will set the power level of battery device 112 to the specified power level of S1.

Once site gateway 124 has received the schedules and their associated priority information from control server 128, site gateway 124 can regulate the charging and discharging of battery device 112 based on that information (block 306). In one embodiment, this step can include processing the schedules and the priority information to determine, at a given point in time, what the power level of battery device 112 should be. Site gateway 124 can then send control signals to battery inverter/charger 110 to charge or discharge battery device 112 in accordance with the results of that processing.

Figure 8:
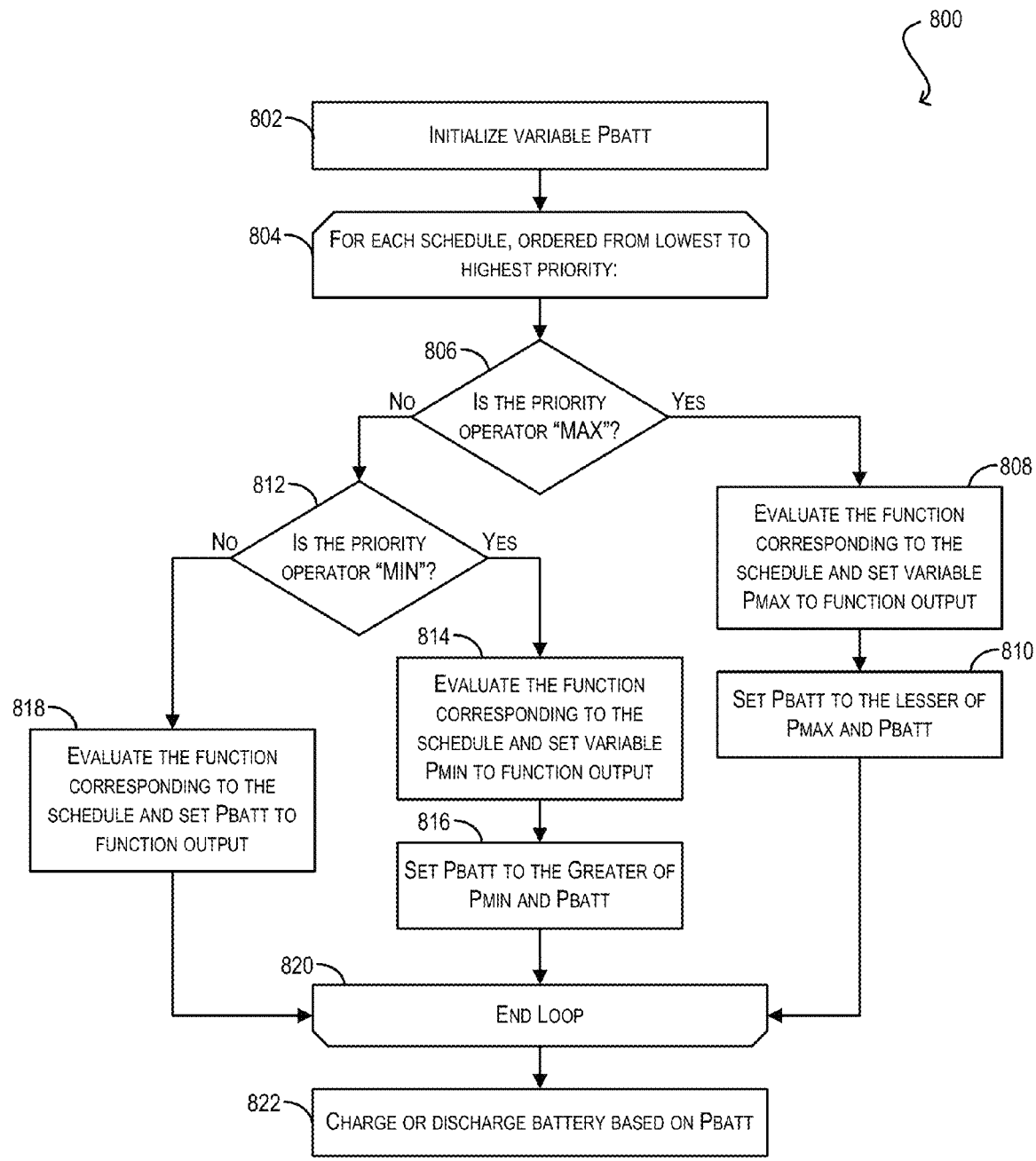
FIG. 8 is a flow diagram of a process for processing a plurality of schedules according to an embodiment of the present invention.

FIG. 8 illustrates a process 800 can that be performed by site gateway 124 to carry out the processing at block 306 of FIG. 3. At block 802, site gateway 124 can initialize a variable $P_{batt}$, which represents the desired output power level for battery device 112. At block 804, site gateway 124 can enter a loop for the schedules received at block 302 of FIG. 3, where the schedules are processed from lowest to highest priority.

Within the loop, site gateway 124 can determine whether the priority operator for the current schedule is the max operator (block 806). If so, site gateway 124 can evaluate the function corresponding to the schedule and set a variable $P_{max}$ to the function output (block 808). Site gateway 124 can then set variable $P_{batt}$ to the lesser of $P_{max}$ and $P_{batt}$ (block 810). Thus, $P_{max}$ acts a maximum permissible upper bound on the power level of battery device 112 with respect to the current schedule and all schedules of lesser priority.

If the priority operator is not the max operator, site gateway 124 can determine whether the priority operator is the min operator (block 812). If so, site gateway 124 can evaluate the function corresponding to the schedule and set a variable $P_{min}$ to the function output (block 814). Site gateway 124 can then set variable $P_{batt}$ to the greater of $P_{min}$ and $P_{batt}$ (block 816). Thus, $P_{min}$ acts as a minimum permissible lower bound on the power level of battery device 112 with respect to the current schedule and all schedules of lesser priority.

If the priority operator is not the min operator, site gateway 124 can assume that the priority operator corresponds to "target." In this case, site gateway 124 can evaluate the function corresponding to the schedule and set variable $P_{batt}$ to the function output (block 818). Thus, the function output is directly mapped to the power level of battery device 112.

At block 820, process 800 can loop back to block 804 until all of the schedules have been processed in order (from lowest to highest priority). Finally, at block 822, site gateway 124 can send control signals to battery inverter/charger 110 for charging or discharging battery device 112 in accordance with the value of variable $P_{batt}$.

Although not shown in FIG. 8, in certain embodiments each schedule can be associated with a start time indicating a time at which the schedule should take effect for controlling the charging/discharging of battery device 112, and/or an end time indicating a time at which the schedule should no longer take effect for controlling the charging/discharging of battery device 112. In a particular embodiment, each of these start and end times can be dependent on a time at which site gateway 124 last made contact with control server 128. This timing information can then be used to filter the list of schedules that are processed by site gateway 124 per process 800 of FIG. 8.

For example, assume a schedule U1 is received at site gateway 124 that is designed to reserve a certain percentage of battery capacity for utility use (in other words, U1 is a utility-requested schedule). If site gateway 124 were to lose contact with control server 128 for an extended period of time, it may no longer make sense to continue applying schedule U1, since the schedule may become stale (i.e., U1 may no longer relevant to, or needed by, the utility). Accordingly, schedule U1 can have an associated end time indicating that U1 should no longer take effect if contact has not been made with control server 128 within a certain time period (e.g., one day). Upon executing process 800 of FIG. 8, site gateway 124 can identify the end time associated with U1 and determine whether contact has been made with control server 128 within the time period specified. If not, site gateway 124 can exclude U1 from the list of schedules processed within the loop starting at block 804.

By specifying this schedule timing information, control server 128 can ensure that site gateway 124 continues to control the charging/discharging of battery device 112 in a suitable manner, even when connectivity has been lost between server 128 and site gateway 124. In addition, control server 128 can predict how site gateway 124 will continue to control battery device 112 and other components of EGS system 102. For schedules/functions whose input parameters are based on local (i.e., site specific) values, control server 128 may not know the exact state of battery device 112 or other EGS system components if communication is lost with site gateway 124. However, if the output of the function is bounded by preprogrammed limits, control server 128 may be able to accurately predict a range of states for these components.

Automated Provisioning

In addition to the energy storage control techniques described above, control server 128 and site gateway 124 can interoperate to automate the provisioning and deployment of EGS system 102. Prior art EGS systems generally require a technician to manually program various system components using a physical keypad (or other input interface) prior to initial use. This manual programming requires extensive technical training on the part of the technician, and requires the technician to be on-site. To make things worse, each vendor might have a different provisioning process. Embodiments of the present invention overcome these and other limitations by shifting the burden of programming/configuring EGS system components to site gateway 124/control server 128. With this approach, the entire provisioning process can be completed without any human intervention.

Figure 9:
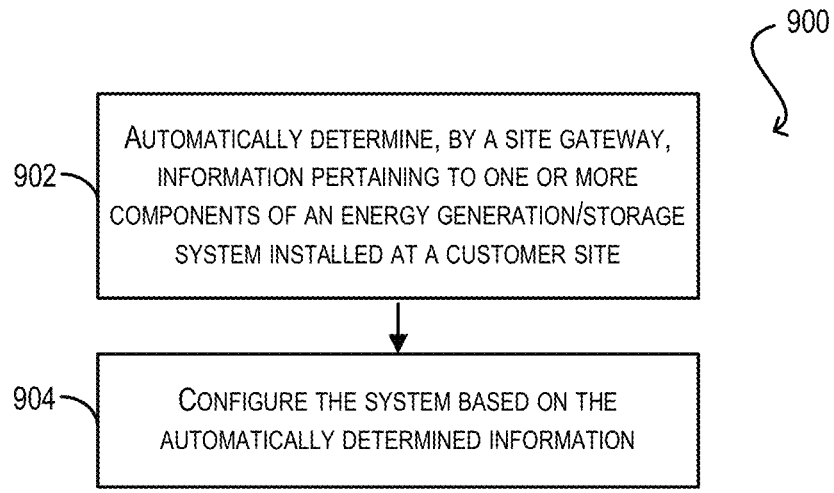
FIG. 9 is a flow diagram of a process for automatically provisioning components of an energy generation and storage system according to an embodiment of the present invention.

FIG. 9 illustrates a process 900 that can be carried out by site gateway 124 for provisioning EGS system 102 according to an embodiment of the present invention. At block 902, site gateway 124 can automatically determine information pertaining to the components of system 102. Such information can include the number of each component type that is installed at the site (e.g., number of installed battery inverters/chargers, number of installed PV inverters, number of installed PV panels, etc.). The automatically determined information can further include the operating specifications of each installed component. For instance, with respect to battery device 112, the operating specifications can comprise the battery's chemistry (e.g., lead acid flooded, lead acid AGM, Li-ion, etc.), capacity (in kWh or Ah), peak charge and discharge rates (in kW), charge limits, nominal voltage, and so on.

At block 904, site gateway 904 can configure EGS system 102 based on the information determined at block 902. In one embodiment, this configuration step can include transmitting commands to the various components of system 102 (e.g., battery inverter/charger 110, battery device 112, PV inverter 106, etc.) for programming the components in accordance with the automatically determined information. This configuration step can further include performing one or more self-programming routines at site gateway 124 such that gateway 124 is configured to interact properly with the system components.

Figure 10:
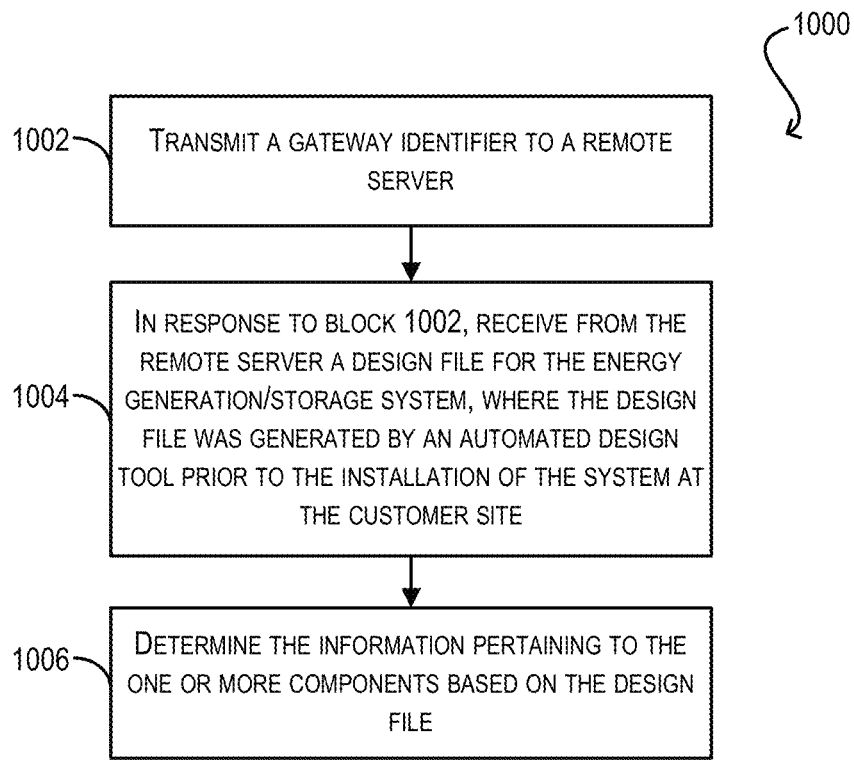
FIG. 10 is a flow diagram of a process for retrieving component information from a remote server according to an embodiment of the present invention.

The specific manner in which site gateway 124 executes the processing at block 902 of FIG. 9 (i.e., the automatic determination of component information) can vary. An example of one approach is shown in FIG. 10 as process 1000. At block 1002, site gateway 124 can transmit a gateway identifier to control server 128 (or to a different remote server). In various embodiments, the gateway identifier can uniquely identify site gateway 124 and/or site 104, and can be used by control server 128 to retrieve information that has been stored for gateway 124/site 104. In a particular embodiment, control server 128 can retrieve, based on the gateway identifier, a design file for site 104, where the design file was generated by an automated design tool prior to the installation of EGS system 102 at site 104. An example of such a design tool is disclosed in U.S. patent application Ser. No. 13/227,139, filed Sep. 7, 2011, entitled "Systems and Methods for Mobile Design Automation."

At block 1004, site gateway 124 can receive the design file from control server 128. Site gateway 124 can then automatically determine information pertaining to the components of EGS system 102 (per block 902 of FIG. 9) based on the design file. For example, the design file can include component information such as make/model numbers, operating specifications, and the like. The design file can also include other types of information that may be useful for configuring system 102, such as site layout data, electrical interconnect diagrams, and more.

Figure 11:
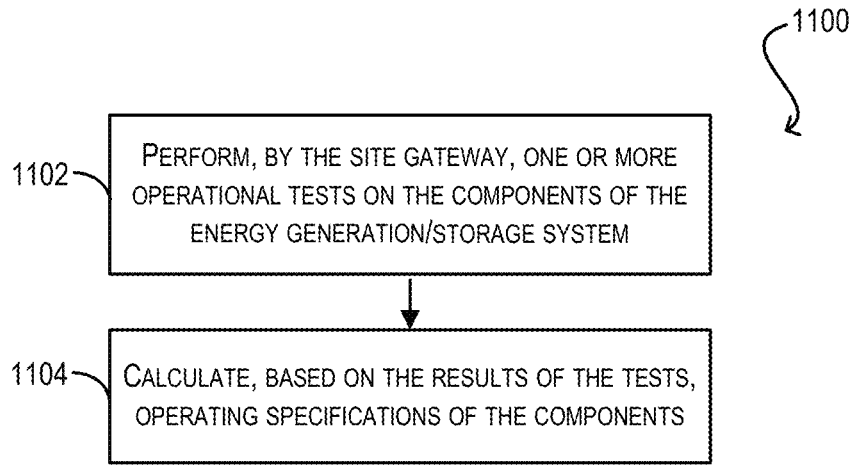
FIG. 11 is a flow diagram of a process for determining component information based on the execution of one or more operational tests according to an embodiment of the present invention.

A second approach to executing the processing at block 902 of FIG. 9 is shown in FIG. 11 as process 1100. At block 1102, site gateway 124 can perform one or more operational tests with respect to the components of EGS system 102. At block 1104, site gateway 124 can calculate, based on the results of the operational tests, certain operating specifications of the components. The calculated specifications can then be used by site gateway 124 to automatically provision system 102.

Process 1100 can be particularly useful for determining component specifications that vary from one component sample to another (due to, e.g., manufacturing variability), or that change or drift over time. In certain embodiments, process 1100 can be performed multiple times over the lifetime of EGS system 102 (rather than simply at the time of provisioning) to calibrate system configuration parameters in view of the actual operating conditions of installed components. In further embodiments, the results of the operational tests can be combined with, and/or analyzed in view of, data received from control server 128 (e.g., average site temperature information) to enhance the accuracy of the calculated specifications.

By way of example, site gateway 124 can use process 1100 to calculate the actual energy storage capacity of battery device 112. In particular, site gateway 124 can measure the voltage of battery device 112 when the battery's state of charge is at 0% ("Vmin"). Site gateway 124 can also measure the voltage of battery device 112 when the battery's state of charge is at 100% ("Vmax"). Site gateway 124 can then discharge battery device 112 (via battery inverter/charger 110) until the battery reaches Vmin, and subsequently charge battery device 112 (via battery inverter/charger 110) until the battery reaches Vmax. During the charging phase, site gateway 124 can measure the flow of energy into battery device 112. The total energy flow into device 112 can be determined to be the actual energy storage capacity of the battery.

As another example, site gateway 124 can use process 1100 to calculate the roundtrip efficiency of battery inverter/charger 110 and battery device 112. As used herein, roundtrip efficiency refers to the percentage of energy fed into an energy storage device that is recoverable when the device is discharged. This value is typically less than 100%, since some of the energy is lost in the energy conversion process, and some is lost due to heat generated by the energy storage device.

In this example, site gateway 124 can measure an initial state of charge of battery device 112 ("SOCinit"). Site gateway 124 can then charge battery device 112 (via battery inverter/charger 110) with a certain quantity (X) of kilowatt hours, and subsequently discharge battery device 112 (via battery inverter/charger 110) until the battery's state of charge returns to SOCinit. During the discharging phase, site gateway 124 can measure the quantity of energy flowing out of battery device 112 (i.e., Y kilowatt hours). Once the discharging is complete, site gateway 124 can calculate the roundtrip efficiency of components 110 and 112 as X/Y multiplied by 100.

Figure 12:
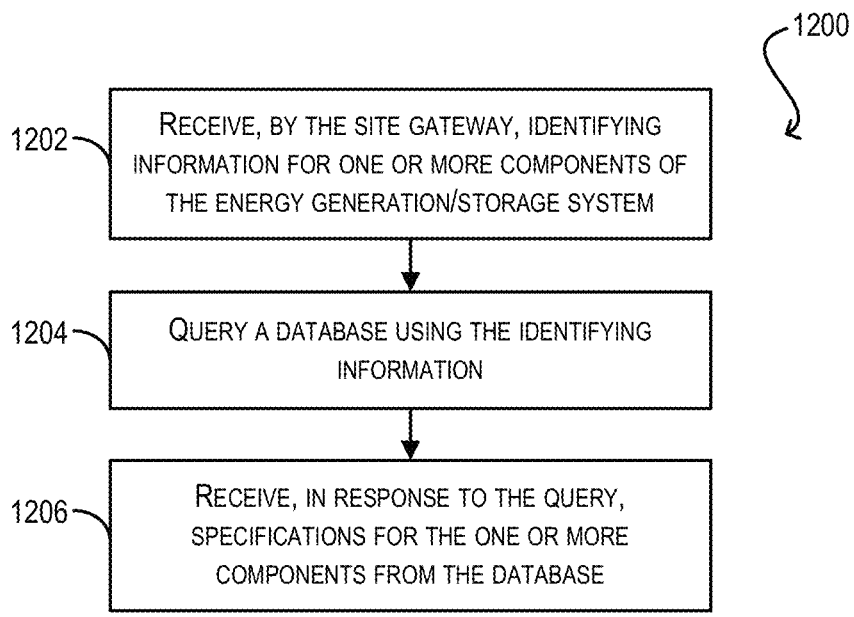
FIG. 12 is a flow diagram of an alternative process for retrieving component information from a remote server according to an embodiment of the present invention.

Finally, a third approach for automatically determining component information per block 902 of FIG. 9 is shown in FIG. 12 as process 1200. At block 1202, site gateway 124 can receive identifying information from various components of EGS system 102 that are capable of communicating with gateway 124. This identifying information can include information that is sufficient to identify the components, but is not sufficient to configure the components for operation. Such identifying information can include, e.g., unit specific unique identifiers (e.g., serial numbers, MAC addresses), brands, model numbers, and the like. In various embodiments, the identifying information can be received from the components of EGS system 102 via wired or wireless (e.g., cellular, Wi-Fi, Bluetooth, etc.) links.

At block 1204, site gateway 124 can query a database using the identifying information received at block 1204. The database can be, e.g., a third-party component database, a database maintained by control server 128, or a database maintained locally on gateway 124. In response to the query, site gateway 124 can receive detailed operating specifications from the database (block 1206). The operating specifications can then be used by gateway 124 to provision the components of EGS system 102.

Software Abstraction Layer

As noted in the Background section, the components installed at a particular EGS system site may be supplied by a number of different vendors, each utilizing different vendor-specific communication protocols. Further, the same site gateway may need to be installed at multiple, distinct sites. This can result in compatibility problems between the site gateway and various system components. To address this, certain embodiments of the present invention can provide, within site gateway 124, a software abstraction layer for translating high-level (i.e., standardized) control commands and operating parameters for EGS system components into low-level, vendor-specific commands and parameters, and vice versa. With this layer, control server 128 and site gateway 124 can utilize control algorithms that view EGS components as generic, rather than vendor-specific, energy generation or storage devices. Accordingly, server 128 and gateway 124 can easily interoperate with a wide range of components that are supplied by different vendors.

Figure 13:
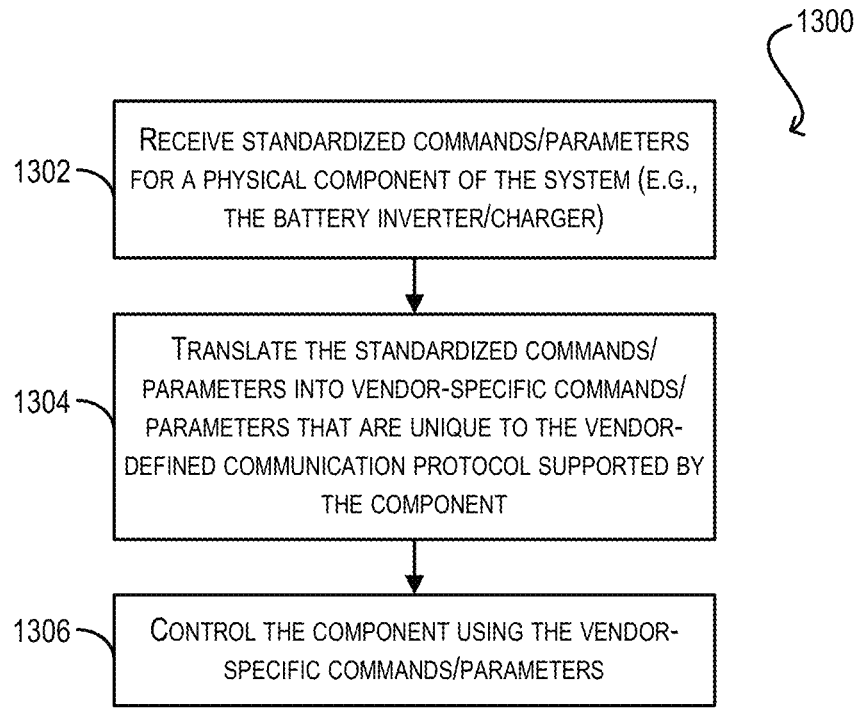
FIG. 13 is a flow diagram of a process for translating standardized operating parameters for a component of an energy generation and storage system into vendor-specific parameters according to an embodiment of the present invention.

FIG. 13 illustrates a translation process 1300 that can be performed by the software abstraction layer of site gateway 124 according to an embodiment of the present invention. At block 1302, site gateway 124 can receive one or more standardized commands/parameters for a physical component of EGS system 102. These standardized commands/parameters can originate from control server 128, or can be generated by site gateway 124 in response to information received from control server 128. As denoted by the term "standardized," the commands/parameters received at block 1302 are not tied to any vendor-specific protocol or format; rather, they are generic commands/parameters that designed to be commonly applicable to a wide range of physical components of a specific type. For example, assume that the standardized commands/parameters received at block 1302 are intended for controlling battery device 112. In this case, one of the parameters can correspond to battery state of charge (expressed as a percentage), which is generically applicable to all battery devices (regardless of vendor/manufacturer).

At block 1304, the software abstraction layer of site gateway 124 can translate the standardized commands/parameters into vendor-specific commands/parameters that are unique to the vendor-defined communication protocol supported by the component. Returning to the example above, assume that the vendor-specific protocol supported by battery device 112 does not expose a specific "state of charge" parameter expressed as a percentage. Instead, assume the vendor-specific protocol exposes battery state of charge in terms of kilowatt hours, and total battery storage capacity in terms of kilowatt hours. In this scenario, the software abstraction layer (which includes a software driver tailored for the vendor-specific protocol of battery device 112) can automatically translate the generic state of charge parameter into the vendor-specific version by, e.g., multiplying state of charge (%) by total storage capacity (kWh) to arrive at state of charge (kWh). Site gateway 124 can then control battery device 112 using the translated parameter (block 1306).

Although not shown in FIG. 13, this translation process can also work in the opposite direction (i.e., from vendor-specific version to standardized version). For instance, assume that battery device 112 communicates the vendor-specific state of charge parameter (in kWh) to site gateway 124. In response, the software abstraction layer of gateway 124 can automatically translate the parameter into the standardized version by, e.g., dividing state of charge (kWh) by total storage capacity (kWh) to arrive at state of charge (%). The standardized state of charge parameter can then be used by site gateway 124, or passed to control server 128, for high-level processing.

Figure 14:
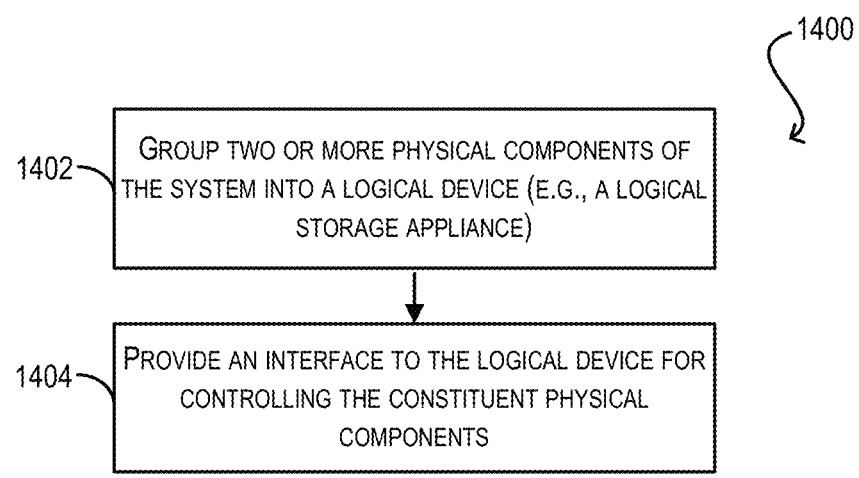
FIG. 14 is a flow diagram of a process for grouping heterogeneous components of an energy generation and storage system into a logical device according to an embodiment of the present invention.

In addition to protocol translation, the software abstraction layer of site gateway 124 can, in certain embodiments, be used to group a number of heterogeneous components of EGS system 102 into a single logical device. The logical device can expose a standardized set of commands and parameters that enable site gateway 124 or control server 128 to interact with the heterogeneous components as a single device, rather than as separate devices. FIG. 14 illustrates a process 1400 for implementing this feature.

At block 1402, site gateway 124 can determine that two or more heterogeneous physical components of EGS system 102 should be grouped into a logical device. This determination can be made, e.g., autonomously by site gateway 124 upon analyzing the installed component list for system 102, in response to a command from control server 128, or in response to input from a human administrator (e.g., a technician on-site at site 104). In a particular embodiment, the grouped components can correspond to parts of an energy storage subsystem, such as battery inverter/charger 110 and battery device 112, and the logical device can correspond to a logical storage appliance.

At block 1404, the software abstraction layer of site gateway 124 can provide a generic interface for controlling the logical device created at block 1402. Using this interface, site gateway 124 and/or control server 128 can control the constituent physical components of the logical device as if they were integrated into a single physical device. For instance, in the case of a logical storage appliance comprising a battery inverter/charger and a battery device, the generic control interface can expose various parameters that are useful for high-level control and analysis of the battery inverter/charger and the battery device as whole, such as temperature, state of charge (%), state of health (%), energy capacity (kWh), peak power output (kW), peak power input (kW), and the like. At the same time, the generic control interface can hide certain parameters that may not be as relevant for high-level control and analysis, such as DC voltage, minimum/maximum voltage, maximum current, and the like.

In one embodiment, the software abstraction layer of site gateway 124 can perform a translation process (similar to process 1300 of FIG. 13) for translating commands/parameters exposed by the generic interface of the logical device into component-specific parameters, and vice versa. For example, assume control server 128 is interested in the peak power output of a logical storage appliance comprising battery inverter/charger 110 and battery device 112 of system 102. Further, assume that battery inverter/charger 110 and battery device 112 are configured to report their respective peak power outputs as separate values to site gateway 124. In this situation, the software abstraction layer of gateway 124 can calculate the system peak power output of the logical storage appliance as the lesser of the inverter/charger peak power output and the battery device peak power output. This system peak power output value can then be reported to control server 128.

Figure 15:
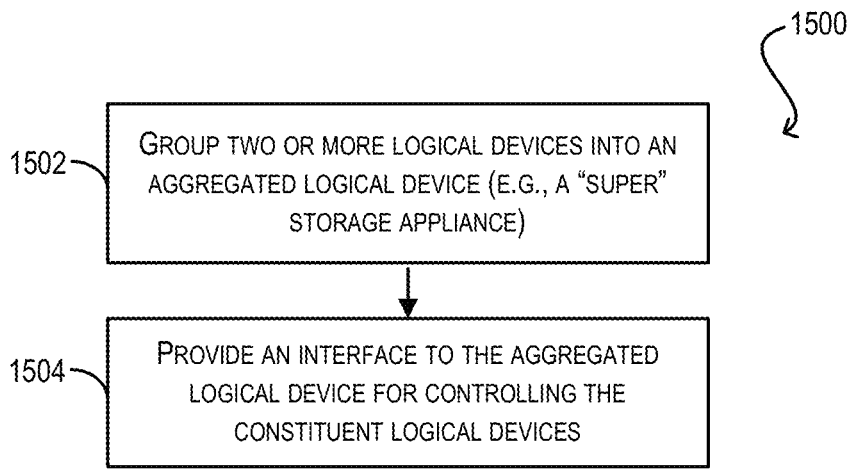
FIG. 15 is a flow diagram of a process for grouping multiple logical devices into an aggregated logical device according to an embodiment of the present invention.

FIG. 15 illustrates a process 1500 for extending the grouping concept described with respect to FIG. 14 one step further, such that logical devices created per process 1400 are themselves grouped to facilitate high-level control. At block 1502, site gateway 124 can determine that two or more logical devices should be grouped into an aggregated logical device. In one embodiment, each of the logical devices can correspond to a logical storage appliance as described above, and the aggregated logical device can correspond to a "super" storage appliance. The super storage appliance can have characteristics/specifications that are a combination of the characteristics/specifications of the constituent logical storage appliances. For example, if the super storage appliance is comprised of three logical storage appliances that each have a peak power output of 5 kW, the super storage appliance can have a peak power output of 3×5 kW, or 15 kW total.

At block 1504, the software abstraction layer of site gateway 124 can provide a generic interface for controlling the aggregated logical device created at block 1502. Using this interface, site gateway 124 and/or control server 128 can control the logical components of the aggregated logical device as if they were integrated into a single device. For instance, in the scenario of a super storage appliance, the generic control interface can allow site gateway 124 and/or control server 128 to interact with the super storage appliance as a single, large energy storage system, without any need to know the actual physical composition of the appliance. Any commands or parameters that are transmitted by site gateway 124 or control server 128 for controlling the super storage appliance as a whole can be automatically translated by the software abstraction layer into low-level commands/parameters that are formatted for the individual physical components of the super storage appliance.

In one set of embodiments, process 1500 can be applied to group together logical devices that are installed at a single site. In other embodiments, process 1500 can be applied to group together logical devices that are installed at multiple, distinct sites. In the latter case, the generic interface for controlling the aggregated logical device can be provided/implemented by control server 128 rather than by a specific site gateway.

Load Balancing and Adjusting Published Operating Parameters

Figure 16:
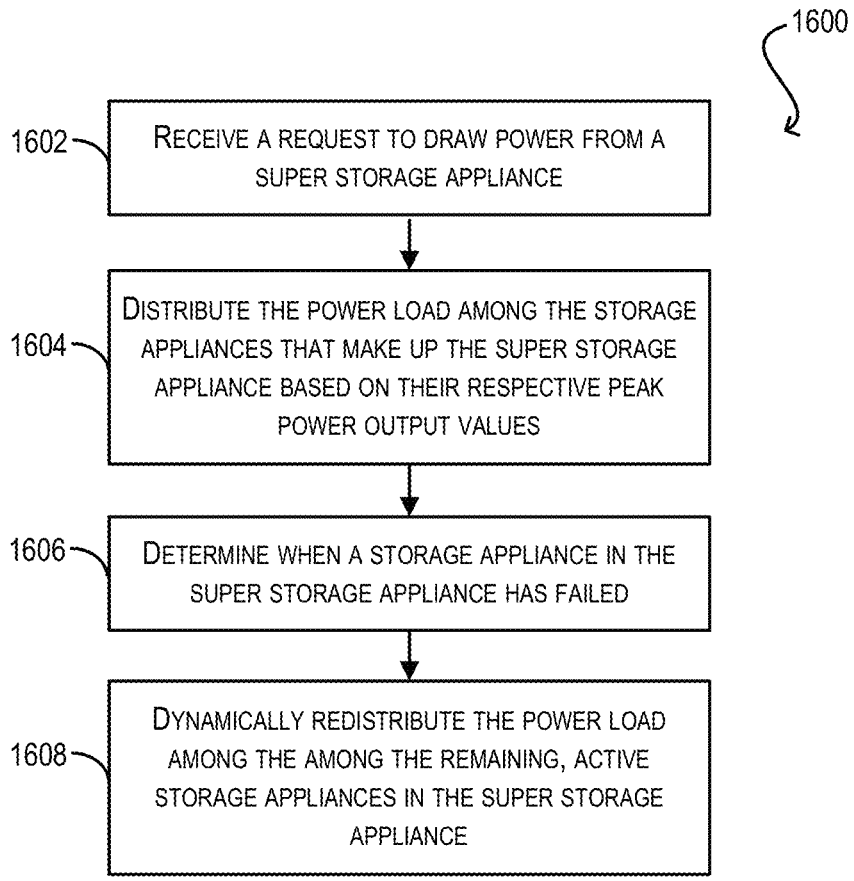
FIG. 16 is a flow diagram of a process for dynamically redistributing power loads across devices of an aggregated logical device according to an embodiment of the present invention.

In embodiments where a super storage appliance has been defined per the processing of FIG. 15, the software abstraction layer of site gateway 124 can perform certain functions for optimizing the appliance's operation. For example, FIG. 16 illustrates a process 1600 that can be performed by the software abstraction layer for load balancing power requests that are directed at a super storage appliance. At block 1602, the software abstraction layer can receive a request to draw power from a super storage appliance. This request may be derived from, e.g., a control command received from control server 128 or generated by site gateway 124.

At block 1604, the software abstraction layer can distribute the power load among the logical storage appliances that make up the super storage appliance based on their respective power output values. For instance, assume that the super storage appliance is composed of ten logical storage appliances, and that each logical storage appliance has a peak power output of 5 kW (resulting in a combined peak power output of 50 kW). Further, assume that the request received at block 1602 is for 30 kW of power. In this example, the software abstraction layer can apportion the request such that each logical storage appliance supplies (30/10) or 3 kW of power. Thus, power draw is evenly balanced across the constituent components of the super storage appliance.

In some cases, one or more logical storage appliances in a super storage appliance may fail or otherwise become unresponsive for various reasons (e.g., component failure, communication link failure, etc.). In these scenarios, the failure can be identified (block 1606) and the power load can be automatically redistributed among the remaining, active appliances (block 1608). Thus, in the example above, if one of the ten logical storage appliances fail, the original request for 30 kW can be redistributed such each nine remaining logical storage appliances supply (30/9) or 3.33 kW of power. In this manner, the super storage appliance can continue to provide the requested amount of power in the face of constituent appliance failures.

Figure 17:
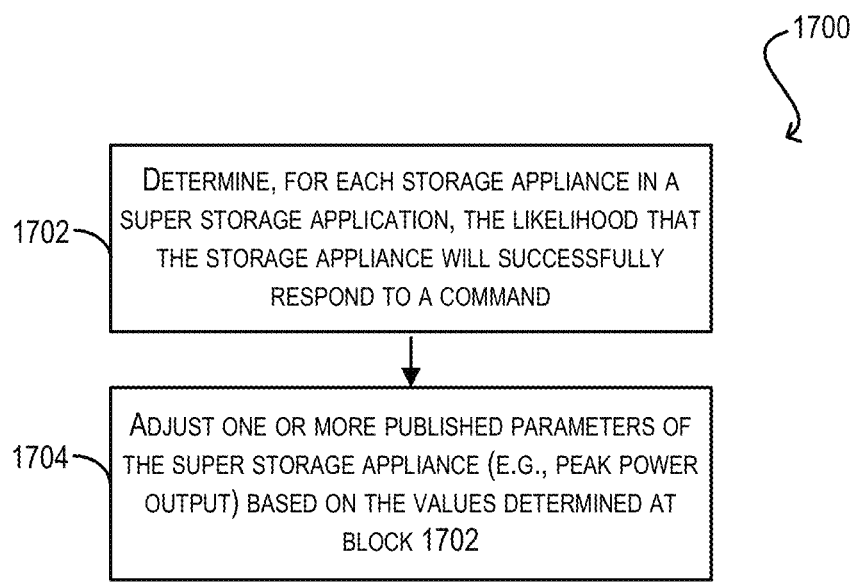
FIG. 17 is a flow diagram of a process for adjusting published parameters of an aggregated logical device based on likely failure or success rates of constituent devices in the aggregated logical device according to an embodiment of the present invention.

As an alternative, or addition, to the load balancing feature above, the software abstraction layer can, in certain embodiments, preemptively adjust the published/exposed operating parameters of a super storage appliance in view of potential appliance failures. FIG. 17 illustrates a process 1700 for implementing this feature. At block 1702, the software abstraction layer can determine, for each logical storage appliance in the super storage appliance, the probability that the logical appliance will successfully respond to (or fail to respond to) a control command. These probabilities can be based on a variety of factors, such as historical failure data for the specific components comprising the logical appliances, average site temperature, etc.

At block 1704, the software abstraction layer can automatically adjust one or more published parameters of the super storage appliance, such as peak power output, based on the probabilities determined at block 1702. For example, assume each logical storage appliance in a group of ten such appliances making up a super storage appliance has a peak power output of 5 kW, and has a 90% probability of accepting a control command (in other words, 10% of the time the logical appliance will be unresponsive). In this case, the software abstraction layer will not expose the super storage appliance's full peak power output (10×5 kW, or 50 kW) via the appliance's control interface. Instead, the software abstraction layer will adjust the exposed peak power output down in accordance with the probability values, such that the exposed value is (90%×10×5 kW), or 45 kW. Thus, higher-level control algorithms will never be able to request more than 45 kW of power from the super storage appliance, despite its theoretical peak power output of 50 kW. This reduces the likelihood that such algorithms will request more power than can actually be supplied by the super storage appliance in practice.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. For example, although certain embodiments have been described with respect to particular process flows and steps, it should be apparent to those skilled in the art that the scope of the present invention is not strictly limited to the described flows and steps. Steps described as sequential may be executed in parallel, order of steps may be varied, and steps may be modified, combined, added, or omitted. As another example, although certain embodiments have been described using a particular combination of hardware and software, it should be recognized that other combinations of hardware and software are possible, and that specific operations described as being implemented in software can also be implemented in hardware and vice versa.

The specification and drawings are, accordingly, to be regarded in an illustrative rather than restrictive sense. Other arrangements, embodiments, implementations and equivalents will be evident to those skilled in the art and may be employed without departing from the spirit and scope of the invention as set forth in the following claims.

What is claimed is:

1. A method comprising:
   receiving, by a site gateway from a control server, a plurality of schedules for controlling charging and discharging of an energy storage device, each schedule in the plurality of schedules corresponding to a function that takes as input one or more input parameters and returns as output an output parameter corresponding to a power level for the energy storage device;
   determining, by the site gateway, relative priorities for the plurality of schedules;
   determining, by the site gateway, conflicting schedules within the plurality of schedules, wherein the output parameters of each of the conflicting schedules correspond to different desired output power levels of the energy storage device; and
   selecting, by the site gateway, one of the conflicting schedules based on their relative priorities to control charging and discharging of the energy storage device.

2. The method of claim 1 wherein determining the relative priorities for the plurality of schedules comprises receiving priority information from the control server.

3. The method of claim 2 wherein the priority information includes, for each schedule in the plurality of schedules, a schedule identifier, a priority value, and a priority operator.

4. The method of claim 3 wherein the priority operator is selected from a group consisting of max, min, and target,
   wherein the max priority operator indicates that the function corresponding to the schedule defines a maximum permissible upper bound on the power level for the energy storage device,
   wherein the min priority operator indicates that the function corresponding to the schedule defines a minimum permissible lower bound on the power level for the energy storage device, and
   wherein the target priority operator indicates that the function corresponding to the schedule defines an exact power level for the energy storage device.

5. The method of claim 4 wherein controlling charging and discharging of the energy storage device based on the plurality of schedules and their relative priorities comprises:
   initializing a variable Pbatt; and
   for each schedule in the plurality of schedules, ordered from lowest priority to highest priority:
      if the priority operator for the schedule is max:
         evaluating the function corresponding to the schedule and setting a variable Pmax to the function output; and
         setting Pbatt to the lesser of Pmax and Pbatt;
      else if the priority operator for the schedule is min:
         evaluating the function corresponding to the schedule and setting a variable Pmin to the function output; and
         setting Pbatt to the greater of Pmin and Pbatt;
      else if the priority operator for the schedule is target:
         evaluating the function corresponding to the schedule and setting Pbatt to the function output.

6. The method of claim 5 further comprising charging or discharging the energy storage device based on Pbatt.

7. The method of claim 1 wherein at least one schedule in the plurality of schedules corresponds to a function that takes as input two or more input parameters.

8. The method of claim 7 wherein the two or more input parameters include time of day, state of charge of the energy storage device, or site power consumption.

9. The method of claim 7 wherein the function is expressed as an N-dimensional array, each value in the array representing a power level for the energy storage device, each dimension of the array representing an input parameter of the function.

10. The method of claim 1 wherein each schedule in the plurality of schedules is based on one or more use cases for optimizing economic value of the energy storage device, wherein the energy storage device is part of an energy generation system, and wherein the relative priorities are determined according to boundaries of output power levels of the energy storage device of the energy storage system.

11. The method of claim 10 wherein the one or more use cases include a use case for keeping a predefined percentage of energy storage device energy reserved for critical loads, a use case for keeping peak power demand below a predefined threshold, and a use case for buying and selling energy storage device energy at predefined times of day.

12. The method of claim 10 wherein at least one schedule the plurality of schedules is defined by a utility company configured to provide power for charging the energy storage device.

13. The method of claim 1 wherein each schedule in the plurality of schedules is associated with a start time indicating a time at which the schedule should take effect for controlling charging and discharging of the energy storage device.

14. The method of claim 13 wherein the start time is dependent on a time at which the site gateway last made contact with the control server.

15. The method of claim 13 wherein each schedule in the plurality of schedules is further associated with an end time indicating a time at which the schedule should no longer take effect for controlling charging and discharging of the energy storage device.

16. The method of claim 15 wherein the end time is dependent on the time at which the site gateway last made contact with the control server.

17. The method of claim 1 wherein the energy storage device is a battery, and wherein the site gateway is configured to control the energy storage device by communicating with a battery inverter/charger.

18. The method of claim 17 wherein the site gateway is further configured to communicate with an energy inverter coupled with an energy generation source and with a utility meter coupled with a utility power grid, and wherein the energy storage device is capable of being charged using energy received from the energy generation source or from the utility power grid.

19. A system comprising:
a processor configured to:
receive, from a control server, a plurality of schedules for controlling charging and discharging of an energy storage device, each schedule in the plurality of schedules corresponding to a function that takes as input one or more input parameters and returns as output an output parameter corresponding to a power level for the energy storage device;
determine relative priorities for the plurality of schedules;
determine, by the site gateway, conflicting schedules within the plurality of schedules, wherein the output parameters of each of the conflicting schedules correspond to different desired output power levels of the energy storage device; and
select, by the site gateway, one of the conflicting schedules based on their relative priorities to control charging and discharging of the energy storage device.

20. The non-transitory computer-readable storage medium having stored thereon program code executable by a computer system, the program code comprising:
code that causes the computer system to receive, from a control server, a plurality of schedules for controlling charging and discharging of an energy storage device, each schedule in the plurality of schedules corresponding to a function that takes as input one or more input parameters and returns as output an output parameter corresponding to a power level for the energy storage device;
code that causes the computer system to determine relative priorities for the plurality of schedules;
code that causes the computer system to determine, by the site gateway, conflicting schedules within the plurality of schedules, wherein the output parameters of each of the conflicting schedules correspond to different desired output power levels of the energy storage device; and
code that causes the computer system to select, by the site gateway, one of the conflicting schedules based on their relative priorities to control charging and discharging of the energy storage device.

* * * * *